United States Patent [19]
Sakamoto

[11] Patent Number: 6,063,130
[45] Date of Patent: May 16, 2000

[54] CIRCUIT SIMULATION METHOD

[75] Inventor: Akihiro Sakamoto, Tokyo, Japan

[73] Assignee: NEC Corporation, Tokyo, Japan

[21] Appl. No.: 08/884,264

[22] Filed: Jun. 27, 1997

[30] Foreign Application Priority Data

Jun. 27, 1996 [JP] Japan .................................. 8-167902

[51] Int. Cl.[7] .................................................. G06F 17/50
[52] U.S. Cl. .............................. 703/14; 703/17; 703/18; 703/19; 703/2
[58] Field of Search ................................. 364/488–491, 364/578; 395/500, 500.34, 500.35, 500.36, 500.37, 500.38, 500.39, 500.23

[56] References Cited

U.S. PATENT DOCUMENTS

| | | | |
|---|---|---|---|
| 5,181,179 | 1/1993 | Fang et al. ............................. | 364/488 |
| 5,313,398 | 5/1994 | Rohrer et al. ........................... | 364/468 |
| 5,369,594 | 11/1994 | Huang et al. ........................... | 364/489 |
| 5,682,336 | 10/1997 | Chian et al. ............................ | 364/578 |
| 5,787,008 | 4/1996 | Pullela et al. .......................... | 364/489 |

FOREIGN PATENT DOCUMENTS 7-129637  5/1995  Japan .

*Primary Examiner*—Kevin J. Teska
*Assistant Examiner*—Samuel Broda
*Attorney, Agent, or Firm*—Foley & Lardner

[57] ABSTRACT

In a circuit simulation method, circuit information of an electronic circuit to be simulated is inputted, and whether or not a linear circuit element circuit included in the electronic circuit is passive, is discriminated. For this discrimination, an inductance matrix of the electronic circuit is prepared, and, before a circuit analysis by a circuit simulator, whether or not the inductance matrix is a positive definite is discriminated by obtaining and checking the value of minor determinants of the matrix, and by determining that the circuit is passive if the values of the diagonal items in the matrix are positive definites, and that the circuit is not passive if at least one of the values of the diagonal items in the matrix is not a positive definite. In the latter case, from information of the minor determinants, additional information indicating a cause for non-passivity is derived and outputted.

7 Claims, 6 Drawing Sheets

Fig. 3A
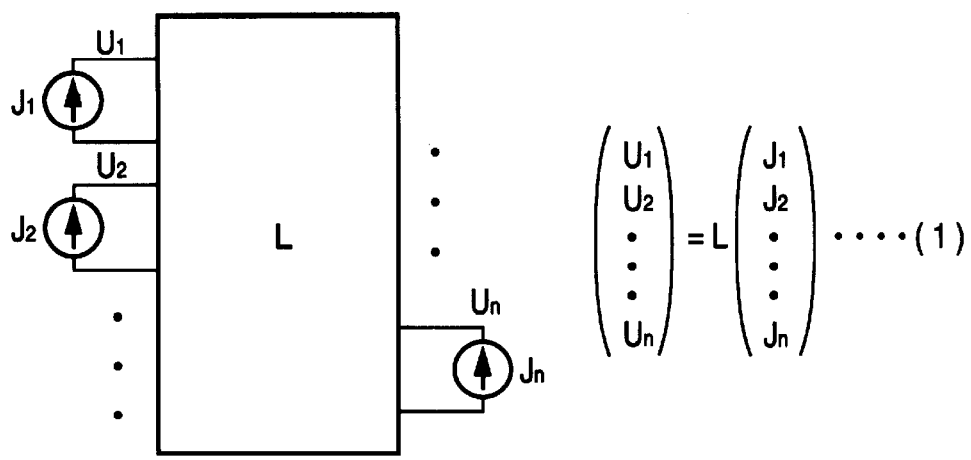
Fig. 3B
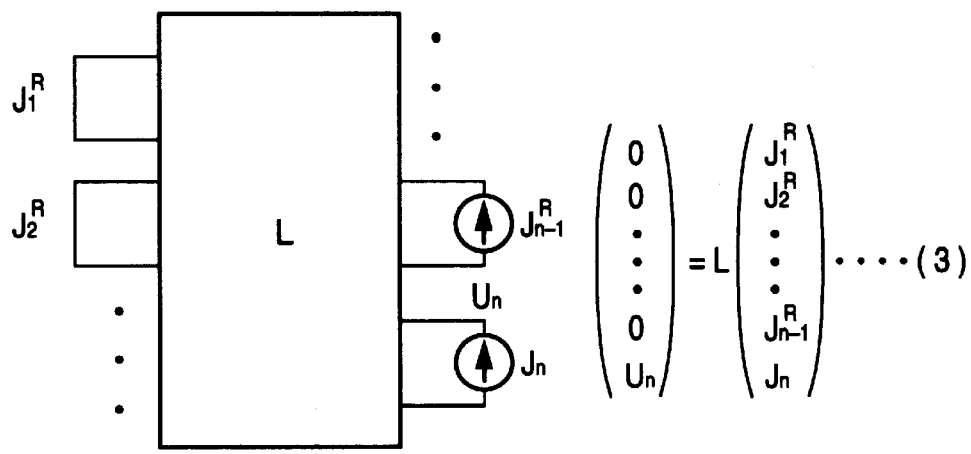
Fig. 4

CIRCUIT SIMULATION METHOD

BACKGROUND OF THE INVENTION

1. Field of the Invention

The present invention relates to a simulation method for an electronic circuit, and more specifically to a circuit simulation method for detecting an error in values of inductance and mutual inductance in a circuit composed of linear circuit elements.

2. Description of Related Art

In the prior art, a circuit simulator typified by "SPICE" (Simulation Program with Integrated Circuit Emphasis) has been used in order to analyze electric characteristics of an electronic circuit. In this circuit simulator, as shown in FIG. 1, circuit information 21 composed of a circuit structure 22 including interconnection relations between circuit elements and circuit element characteristics 23 including resistance values, mutual inductance values, model parameters of transistors, etc., are inputted to a circuit simulation unit 20, which has a function of analyzing DC characteristics, switching characteristics, etc. of the circuit. The circuit simulation unit 20 outputs the result of the analysis to a circuit characteristics file 24. Based on the result of the analysis, a circuit designer confirms the result of his design and makes selection of a draft design.

In the case of analyzing the circuit characteristics by use of the circuit simulator such as SPICE, when the parameters of the circuit to be analyzed include errors, a correct analysis cannot be often carried out. In particular, when the element characteristics of the mutual inductance is erroneous, a linear circuit element network which should be inherently passive, loses passivity in some situation. In this case, node voltage causes oscillation, so that the simulation can be no longer carried out. In general, in order to check the passivity of this type circuit, it is sufficient if examination is made as to whether or not all real-number parts in eigenvalues of a circuit matrix are positive definites.

As a second prior art, Japanese Patent Application Pre-examination Publication No. JP-A-07-129637 (an English abstract of which is available from the Japanese Patent Office, and the content of the English abstract of JP-A-07-129637 is incorporated by reference in its entirety into this application) discloses a method for displaying the eigenvalues of the circuit matrix by use of a transient analysis of the circuit simulator.

FIG. 2 is a flowchart illustrating this second prior art. In a step S21, circuit information is input, and in a step S22, a time Tcal for calculating the eigenvalue is read. In succeeding steps S23 and S24, a circuit matrix is prepared, and a DC analysis is carried out. In a step S25, a transient analysis is conducted, and when the analysis time becomes the time Tcal, matrix data is written into a magnetic disk. After a series of steps (S31 to S36) for the transient analysis are completed, a step S26 for processing the eigenvalue display is conducted. In brief, the matrix data is read out (step S37), and the eigenvalue is calculated on the basis of the read-out matrix data (step S38). A real-number part and an imaginary-number part of the calculated eigenvalue are displayed on an X coordinate axis and a Y coordinate axis, respectively (step S39).

However, the following problems have been encountered in the prior art example shown in FIG. 2. First, since the data is prepared by use of the circuit simulator, the circuit simulation is necessarily executed without exception, and therefore, before execution of the circuit simulation, it is not possible to check whether or not the circuit concerned is passive. Secondly, in order to obtain the eigenvalue from the circuit matrix, a calculation needs a large time when the number of elements, namely, items, in the matrix are large. This approach is not suitable when the scale of the circuit to be analyzed is large.

In the prior art example shown in FIG. 2, furthermore, it is possible to discriminate that the circuit is not passive, by visually observing the display coordinate on which the eigenvalues are plotted. However, it is not possible to discriminate what is a cause for non-passivity of the circuit, namely, which of circuit elements included in the circuit has a problem. As a result, in order to locate a cause for the non-passivity, it is necessary to repeat such an trial-and-error operation that the circuit information is changed and the eigenvalues at that time are checked.

SUMMARY OF THE INVENTION

Accordingly, it is an object of the present invention to provide a circuit simulation method which has overcome the above mentioned defect of the conventional one.

Another object of the present invention is to provide a circuit simulation method capable of quickly discriminating whether or not the circuit is passive, before the circuit characteristics is analyzed by a circuit simulator, and of specifying the cause when the circuit is not passive.

The above and other objects of the present invention are achieved in accordance with the present invention by a circuit simulation method characterized by having a circuit diagnostic process including the steps of inputting circuit information of an electronic circuit to be simulated, discriminating, before a circuit analysis by a circuit simulator, whether or not a linear circuit element circuit included in the electronic circuit is passive, namely, whether or not the linear circuit element circuit is a circuit ceaselessly consuming an electric power, and outputting the result of the discrimination.

In a specific embodiment, the circuit diagnostic process includes the steps of preparing an inductance matrix of the electronic circuit, discriminating whether or not the inductance matrix is a positive definite by obtaining and checking the value of minor determinants of the matrix, and by determining that the circuit is passive if the values of the diagonal items in the matrix are positive definites and that the circuit is not passive if at least one of the values of the diagonal items in the matrix is not a positive definite, and deriving and outputting additional information indicating a cause for non-passivity, from information of the minor determinants when the circuit is not passive. In addition, the value of the minor determinants is discriminated from the values of the diagonal items in a modified matrix which is obtained by processing the inductance matrix by a Gaussian elimination, and the additional information is information of a local inductance matrix obtained by localizing a portion where the value of the diagonal item in the matrix is not a positive definite.

A principle of the present invention is as follows: From a given circuit for simulation, a plurality of sub-circuits of inductance are taken out so that an inductance matrix is prepared, and whether or not the given circuit is passive, is determined on the basis of whether or not the inductance matrix is a positive definite. Namely, whether or not ($D_i/D_{i-1}$) of an inductance matrix of the circuit is larger than 0 (zero) is checked (where i=1, 2, ... , n; and $D_1$ is a minor determinant until (i)th row and (i)th column of the inductance matrix, and $D_0=1$).

(1) In general, as shown in FIG. 3A, assuming that a voltage vector is $U_i$, the inductance matrix L of a circuit connected to a current vector $J_i$ can be expressed by an equation (1) also shown in FIG. 3A, and this is also expressed by the following Hermitian form equation (2):

$$\Lambda = J^E L J = \sum_{i=1}^{n} \lambda_i |Y|^2 > 0 \tag{2}$$

where $J^E$ is a Hermitian conjugate of the current vector J, and Y is an admittance.

The condition for realizing that this matrix L is a positive definite, is the same as the fact that all eigenvalues $\lambda_i$ in the inductance matrix are positive definites. Namely, $\lambda_i > 0$ (i=1, 2, ..., n).

(2) Considering the condition that, as shown in FIG. 3B, the current vectors $J_1, J_2, \ldots J_{n-1}$ of the current vectors $J_i$ are short-circuited, and these short-circuited current vectors are expressed by $J_i^R$ (i=1, 2, ..., n-1), and only the current vector $J_n$ is connected, the equation (1) assumes an equation (3) as shown in FIG. 3B. From this equation (3), the following equations (4) and (5) are derived.

$$U_n = \frac{D_n}{D_{n-1}} J_n \tag{4}$$

$$\sum_{v=1}^{n=1} l_{\mu v} J_v^R = -l_{\mu n} J_n \tag{5}$$

where $l_{\mu v}$ is a $(\mu, v)$ component of the matrix L, and $\mu$ is indicative of a row position and v is indicative of a column position.

From these equations, the quadratic form of the inductance matrix is converted into the following equation (6):

$$\Lambda = \sum_{\mu=1}^{n} \sum_{v=1}^{n} J_{\mu}^* l_{\mu v} J_v \tag{6}$$

$$= \sum_{\mu=1}^{n-1} \sum_{v=1}^{n-1} (J_\mu^* - J_\mu^{*R}) l_{\mu v} (J_v - J_v^R) + \frac{D_n}{D_{n-1}} |J_n|^2$$

where the current vector J* indicates a complex conjugate of the current vector.

Similarly, considering the condition that only the current vector $J_1$ is short-circuited, the equation can be converted into the following equation (7):

$$\Lambda = D_1 |J_1|^2 + \frac{D_2}{D_1} |J_2|^2 + \cdots + \frac{D_n}{D_{n-1}} |J_n|^2 > 0 \tag{7}$$

This equation can be naturally extended to a hybrid circuit matrix, and therefore, the checking of the following equation (8) becomes the same as the checking of the eigenvalues.

$$(D_i/D_{i-1}) > 0 (i=1, 2, \ldots, n) \tag{8}$$

(3) The value of a minor determinant to be checked can be calculated by the same algorithm as a Gaussian elimination. This will be described with reference to the case of a three-row three-column matrix $[a_{11}$ to $a_{33}]$ as diagrammatically shown in FIG. 4. In order to discriminate whether or not this three-row three-column matrix takes a positive definite, there is checked whether values of determinants $D_1$, $(D_2/D_1)$, and $(D_3/D_2)$ are a positive definite or a negative definite. The value of these determinants is the same as the following equations in the matrix of a step "A" in FIG. 4:

$$D_1 = a_{11} > 0 \tag{9}$$

$$= a_{22} > 0 \tag{10}$$

$$= a_{33} > 0 \tag{11}$$

Furthermore, the values of these matrixes are the same as the following equations (12) and (13) calculated by use of the Gaussian elimination in a step "B" and the following equation (14) calculated by use of the Gaussian elimination in a step "C".

$$\frac{D_2}{D_1} = \frac{\begin{vmatrix} a_{11} & a_{12} \\ a_{21} & a_{22} \end{vmatrix}}{a_{11}} = a'_{22} > 0 \tag{12}$$

$$= \frac{\begin{vmatrix} a_{11} & a_{13} \\ a_{31} & a_{33} \end{vmatrix}}{a_{11}} = a'_{33} > 0 \tag{13}$$

$$\frac{D_3}{D_2} = \frac{\begin{vmatrix} a_{11} & a_{12} & a_{13} \\ a_{21} & a_{22} & a_{23} \\ a_{31} & a_{32} & a_{33} \end{vmatrix}}{\begin{vmatrix} a_{11} & a_{12} \\ a_{21} & a_{22} \end{vmatrix}} = a''_{33} > 0 \tag{14}$$

(4) As mentioned above, whether or not the inductance matrix is a positive definite, can be discriminated by checking all diagonal items in the inductance matrix. This corresponds only to check the equations (9), (12) and (14) but also to check the equations (10), (11) and (13) including the diagonal items calculated by the Gaussian elimination. With this, it can be expected to localize or locate a cause for non-passivity and to reduce the amount of necessary calculation. This means the following: By checking the equation (10), it is possible to check one situation of $a_{22} \leq 0$ in the case that the equation (12) is not satisfied, and therefore, it is possible to know that the cause is $a_{22}$. Incidentally, if the equation (10) is checked in the step "A", it is possible to discriminate one situation which does not satisfy the equation (12), before the matrix is converted by the Gaussian elimination in the step "B". Similarly, by checking the equations (11) and (13), it is possible to discriminate that the matrix is not passive, before the matrix is converted into a next step's matrix, and therefore, it is possible to localize or locate a cause for non-passivity and to reduce the amount of necessary calculation.

As seen from the above, the present invention is characterized in the followings:

(1) From the inductance matrix of the circuit, it is possible to discriminate whether or not the circuit is passive. In particular, this discrimination can be obtained before the circuit simulation is executed by a circuit simulator such as SPICE.

(2) Since the positive definite of the matrix is discriminated from the minor determinants obtained in accordance with the Gaussian elimination, it is possible to discriminate quickly as compared with the case that the eigenvalue is obtained in accordance with the Jacobi's method or the like, and whether or not it is a positive definite is discriminated from the eigenvalues thus obtained.

(3) By obtaining the value by use of the Gaussian elimination, it is possible to localize or locate the cause for non-passivity, and also to reduce the amount of necessary calculation.

The above and other objects, features and advantages of the present invention will be apparent from the following description of preferred embodiments of the invention with reference to the accompanying drawings.

BRIEF DESCRIPTION OF THE DRAWINGS

FIGS. 3A and 3B diagrammatically illustrate two cases of the relation between the inductance matrix and the voltage vectors and the current vectors;

FIG. 4 illustrates the process of the Gaussian elimination to a three-row three-column matrix;

DESCRIPTION OF THE PREFERRED EMBODIMENTS

Figure 1:
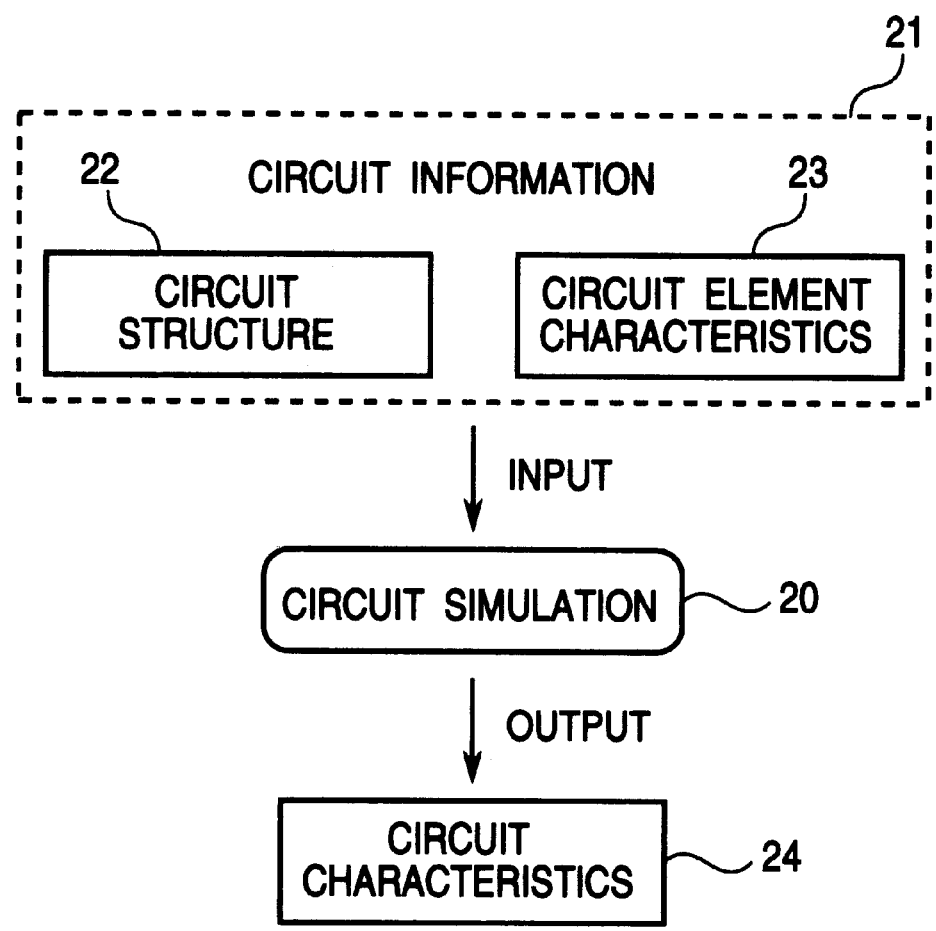
FIG. 1 diagrammatically illustrates a basic flow of the prior art circuit simulation.
Figure 2:
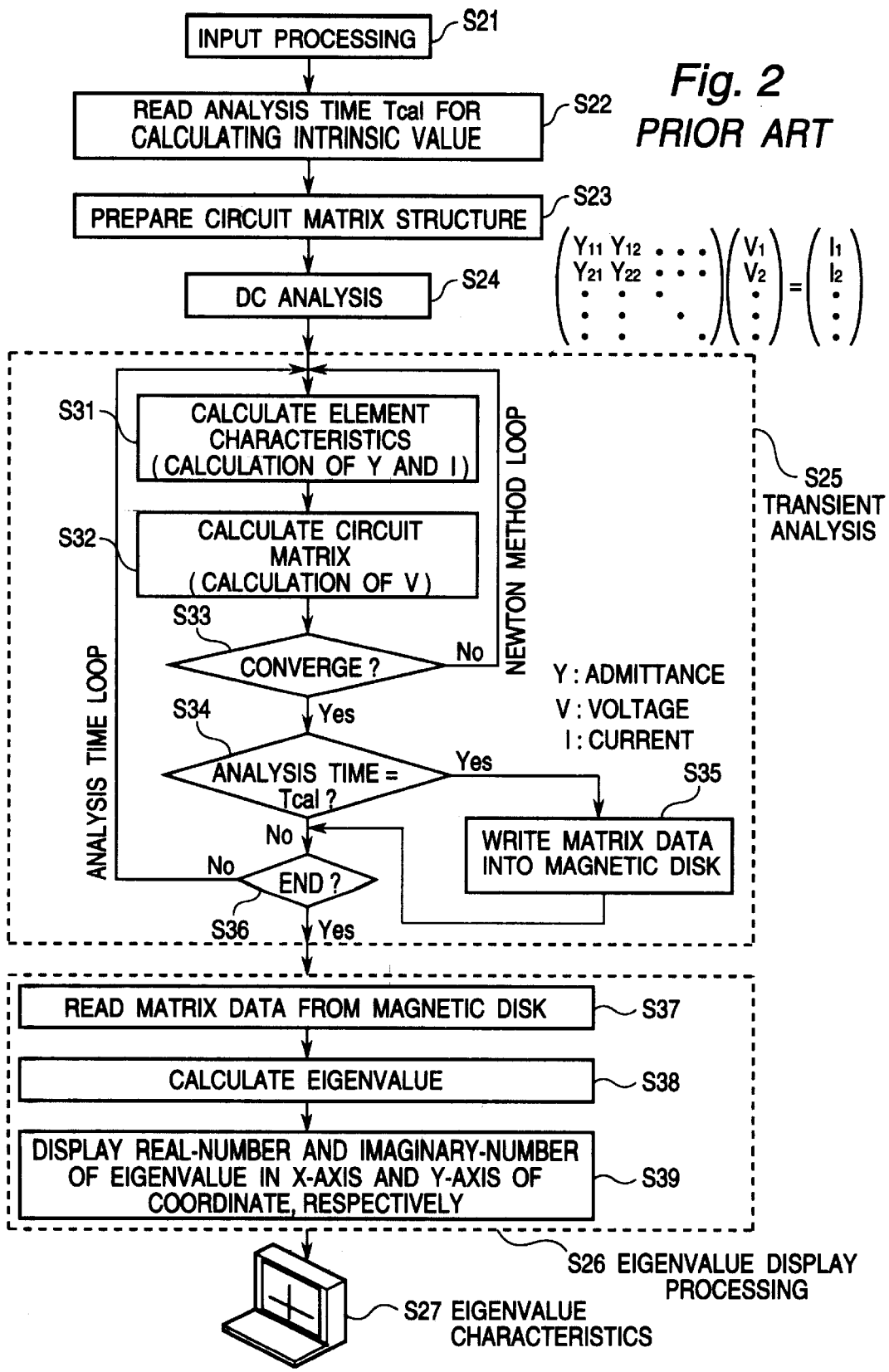
FIG. 2 is a flowchart illustrating a prior art method for displaying the eigenvalues of the circuit matrix by use of a transient analysis of the circuit simulator.
Figure 5:
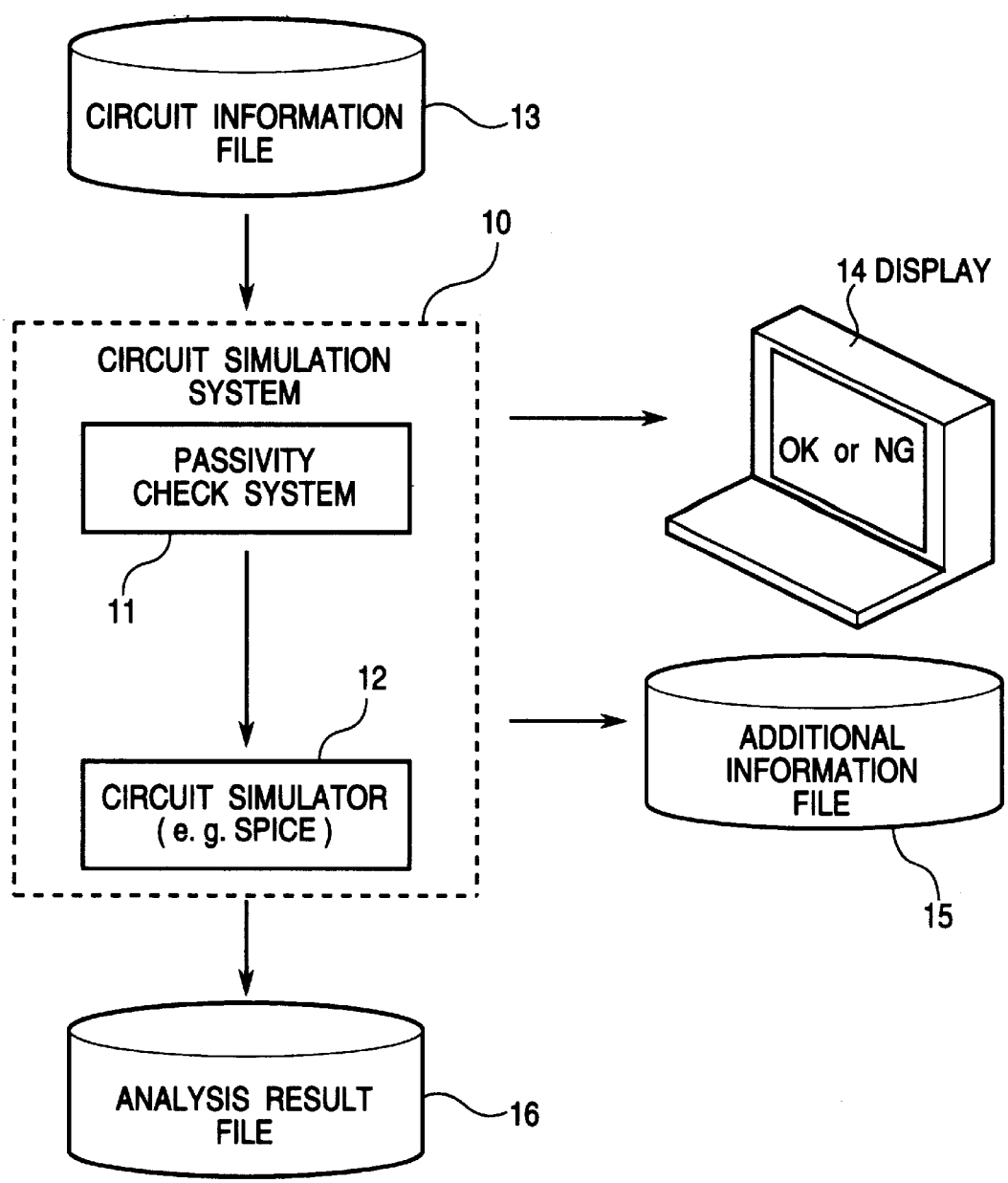
FIG. 5 is a block diagram of a system for performing an embodiment of the circuit simulation method in accordance with the present invention.

Referring to FIG. 5, there is shown a block diagram of a system for performing an embodiment of the circuit simulation method in accordance with the present invention.

In the shown embodiment, a circuit simulation system 10 includes a passivity check system 11, and a circuit simulator 12 constituted of for example SPICE. The circuit simulation system 10 is configured to receive circuit information from a circuit information file 13, and to cause, whether or not the result of the checking is passive, to be displayed in an associated display 14 by "OK" or "NG". When the result of the checking is not passive, the circuit simulation system 10 outputs a cause to the non-passivity to an additional information file 15, and outputs the result of the checking to an analysis result file 16. For example, the circuit simulation system 10 is constituted of a computer, and the passivity check system 11 is realized by a software programmed to execute the operation of the flowchart which will be explain below. The circuit simulator 12 is also realized by a SPICE program.

Figure 6:
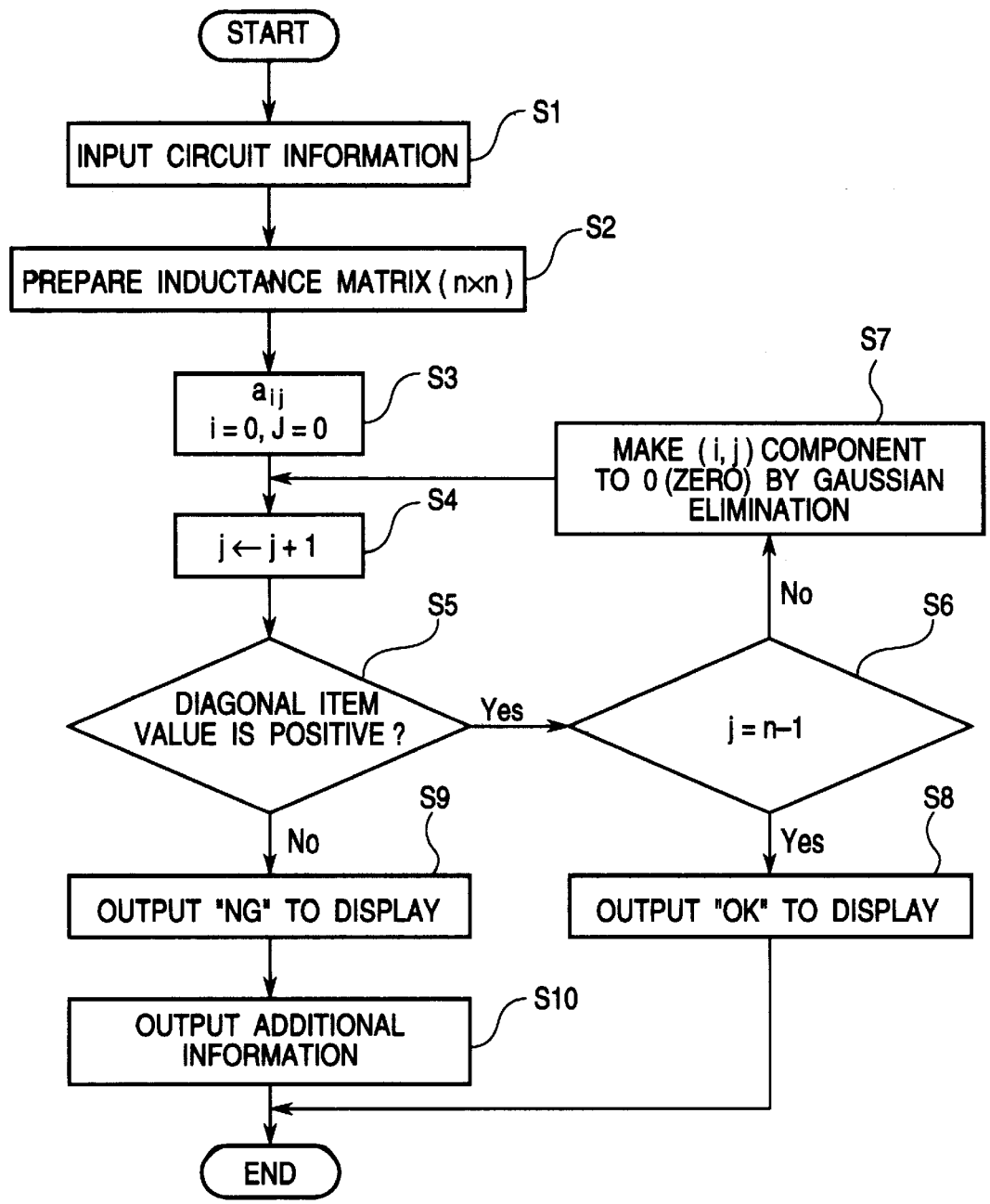
FIG. 6 is a flowchart for illustrating the embodiment of the circuit simulation method in accordance with the present invention.

Whether or not the circuit is passive is determined in accordance with a processing as shown in a flowchart of FIG. 6.

First, in a step S1, circuit information is inputted from the circuit information file 13 to the passivity check system 11 of the circuit simulation system 10, and in a step S2, an inductance matrix (n×n) is prepared in the passivity check system 11. Furthermore, the value of diagonal items in this matrix are checked in steps S3 to S5. In the case of the three-row three-column matrix shown in FIG. 4, first, whether or not $a_{11}>0$ is checked. If $a_{11}>0$, this means that the circuit information concerning a first inductance is passive, namely, good (OK). On the other hand, if $a_{11} \leq 0$, it can be known that the circuit information concerning a first inductance is not passive. Similarly, whether or not $a_{22}>0$ is checked, and whether or not $a_{33}>0$ is checked. If $a_{22}>0$, this means that the circuit information concerning a second inductance is passive, namely, good (OK), and if $a_{33}>0$, this means that the circuit information concerning a third inductance is passive, namely, good (OK). If all of these conditions are satisfied, since $j \neq (n-1)$ in a step S6, the operation goes into a step S7, in which $a_{21}$ and $a_{31}$ are put into 0 (zero) by using the Gaussian elimination of the equations (12) and (13) as shown in FIG. 4.

Next, the operation returns to the steps S4 and S5, and whether or not $a'_{22}>0$ is checked. If $a'_{22}>0$, this means that the relation between the first and second inductances is good (OK). On the other hand, if $a'_{22} \leq 0$, it can be known that the relation between the first and second inductances is not good (NG). Similarly, whether or not $a'_{33}>0$ is checked. If $a'_{33}>0$, this means that the relation between the first and third inductances is good (OK). On the other hand, if $a'_{33} \leq 0$, it can be known that the relation between the first and third inductances is not good (NG). If $a'_{22} \leq 0$ or $a'_{33} \leq 0$, the operation goes to a step S9 where "NG" is displayed, and additional information is also outputted (step S10). If $a'_{22}>0$ and $a'_{33}>0$ are satisfied, since it is still $j \neq (n-1)$ in the step S6, the operation goes into the step S7, again, in which $a'_{32}$ is put into 0 (zero) by using the Gaussian elimination of the equation (14).

Finally, the operation returns to the steps S4 and S5, and whether or not $a''_{33}0$ is checked. If $a''_{33}>0$, the relation between the first, second and third inductances is good (OK). In this case, since $j=(n-1)$ in the step S6, the operation goes to a step S8 where "OK" is displayed. On the other hand, if $a''_{33} \leq 0$, it can be known that the relation between the first, second and third inductances is not good (NG), and therefore, the operation goes to the step S9 where "NG" is displayed, and additional information is also outputted (step S10).

As mentioned above, the processing shown in FIG. 6 for checking whether or not the diagonal items in the matrix are positive definite, is repeated until the component of $(n, n-1)$, namely, $a_{n,\,n-1}$, is put into 0 (zero), in other words, until the matrix is converted into a triangular matrix. If all of these operations are satisfied, "OK" is outputted on a display screen in the step S8. If at least one condition is not satisfied in the above mentioned checking process, "NG" is outputted on the display screen in the step S9.

Figure 7:
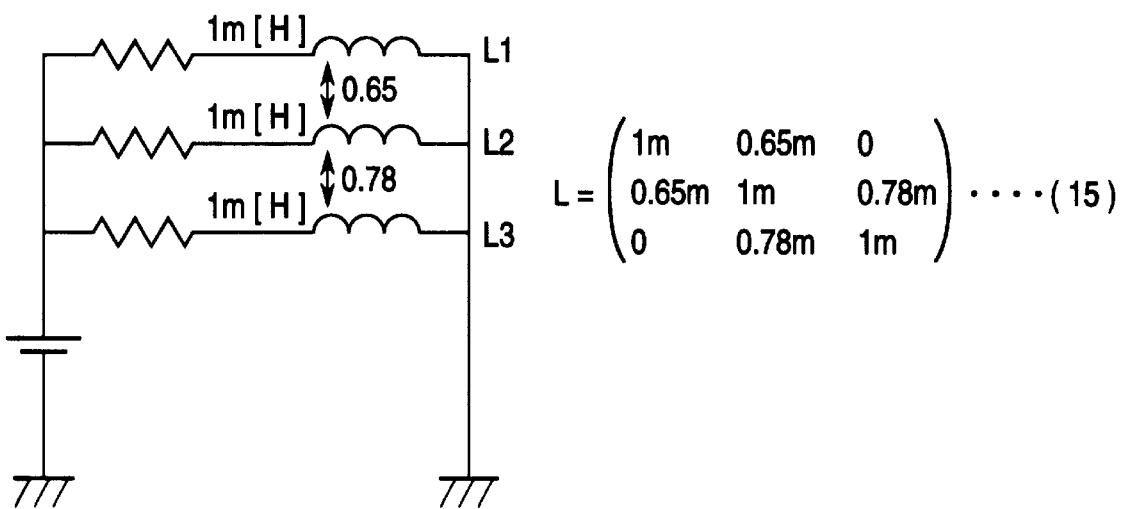
FIG. 7 illustrates a specific example of the case shown in FIG. 4.

Now, explanation will be made on the case of discriminating whether or not a circuit shown in FIG. 7 is passive. The circuit shown in FIG. 7 includes three series circuits each having an inductance L1, L2 or L3 of 1 mH and a resistor connected in series. These series circuits are connected in parallel to one another. In addition, a mutual inductance of 0.65 mH exists between the inductances L1 and L2, and a mutual inductance of 0.78 mH exists between the inductances L2 and L3. In this case, the inductance matrix can be expressed by an equation (15) shown in FIG. 7, but is here expressed by the following equation (16). In the following equation (16), a numerical value of the inductance is expressed in such a manner that, for example, 1 mH is expressed by 1.0000e−03, and 0.65 mH is expressed by 6.5000e−04.

$$L = \begin{pmatrix} 1.0000e-03 & 6.5000e-04 & 0.0000e+00 \\ 6.5000e-04 & 1.0000e-03 & 7.8000e-04 \\ 0.0000e+00 & 7.8000e-04 & 1.0000e-03 \end{pmatrix} \quad (16)$$

Whether or not the diagonal items in this inductance matrix is checked in the step "A". In this example, since all of $a_{11}$, $a_{22}$ and $a_{33}$ are 1.0000e−03, and therefore, positive definite, it is discriminated that the circuit information of L1, L2 and L3 is correct. In the next step "B", the equations (12) and (13) are calculated to execute the Gaussian elimination, so that the following equation (17) is obtained.

$$L = \begin{pmatrix} 1.0000e-03 & 6.5000e-04 & 0.0000e+00 \\ 0.0000e+00 & 5.7750e-04 & 7.8000e-04 \\ 0.0000e+00 & 7.8000e-04 & 1.0000e-03 \end{pmatrix} \quad (17)$$

In this matrix, whether or not the components of (2, 2) and (3, 3) are positive definite, is checked. In this case, since all of $a'_{22}$ and $a'_{33}$ are 5.7750e–04 and 1.0000e–03, respectively, and therefore, positive definite, it is discriminated that the relation between L1 and L2 and the relation between L1 and L3 are good (OK), respectively. Finally, in the next step "C", the equation (14) is calculated to execute the Gaussian elimination, so that the following equation (18) is obtained.

$$L = \begin{pmatrix} 1.0000e-03 & 6.5000e-04 & 0.0000e+00 \\ 0.0000e+00 & 5.7750e-04 & 7.8000e-04 \\ 0.0000e+00 & 0.0000e+00 & -5.3506e-05 \end{pmatrix} \quad (18)$$

In this matrix, whether or not the component of (3, 3) is positive definite, is checked. In this case, since $a''_{33}$ is –5.3506e–05, and therefore, negative, it is discriminated that the relation between L1, L2 and L3 is not good (NG), and therefore, the circuit is not passive.

As mentioned above, according to the present invention, it is possible to avoid occurrence of divergence attributable to an unknown cause, in a process of a circuit transient analysis by a circuit simulator such as SPICE, and to discriminate whether or not the circuit is passive, before the circuit is analyzed by the circuit simulator. In addition, the calculation of the transient analysis in the circuit simulation and the calculation for obtaining the eigenvalues of the matrix, become unnecessary. Therefore, since it is sufficient if the calculation for the Gaussian elimination in the matrix is executed, the calculation time can be shortened, so that it is possible to quickly determine a location where it is not passive.

The invention has thus been shown and described with reference to the specific embodiments. However, it should be noted that the present invention is in no way limited to the details of the illustrated structures but changes and modifications may be made within the scope of the appended claims.

What is claimed is:

1. A circuit simulation method characterized by having a circuit diagnostic process including the steps of:
    inputting circuit information of an electronic circuit to be simulated;
    discriminating using an inductance matrix of the electronic circuit, before a circuit analysis by a circuit simulator, whether or not a linear circuit element circuit included in the electronic circuit is passive; and
    outputting the result of the discrimination.

2. A circuit simulation method claimed in claim 1, wherein the circuit diagnostic process includes the steps of:
    preparing the inductance matrix of the electronic circuit;
    discriminating whether or not the inductance matrix is a positive definite by obtaining and checking the value of minor determinants of the matrix, and by determining that the circuit is passive if the values of the diagonal items in the matrix are positive definites and that the circuit is not passive if at least one of the values of the diagonal items in the matrix is not a positive definite; and
    deriving and outputting additional information indicating a cause for non-passivity, from information of the minor determinants, when the circuit is not passive.

3. A circuit simulation method characterized by having a circuit diagnostic process including the steps of:
    inputting circuit information of an electronic circuit to be simulated;
    discriminating, before a circuit analysis by a circuit simulator, whether or not a linear circuit element circuit included in the electronic circuit is passive by discriminating whether or not the inductance matrix is a positive definite by obtaining and checking the value of minor determinants of the matrix, and by determining that the circuit is passive if the values of the diagonal items in the matrix are positive definites and that the circuit is not passive if at least one of the values of the diagonal items in the matrix is not a positive definite;
    outputting the result of the discrimination; and
    deriving and outputting additional information indicating a cause for non-passivity, from information of the minor determinants, when the circuit is not passive, and wherein the value of the minor determinants is discriminated from the values of the diagonal terms in a modified matrix which is obtained by processing the inductance matrix by a Gaussian elimination, and the additional information is information of a local inductance matrix obtained by localizing a portion where the value of the diagonal item in the matrix is not a positive definite.

4. A circuit simulator for determining whether a linear circuit element circuit included in an electronic circuit is passive before circuit analysis of the electronic circuit by a circuit analysis simulator comprising:
    means for discriminating using an inductance matrix of the electronic circuit, before a circuit analysis by the circuit analysis simulator, whether or not the linear circuit element circuit is passive; and
    means for outputting the result of the discrimination.

5. The circuit simulator of claim 4, wherein the means for discriminating whether or not the linear circuit element circuit is passive further comprises:
    means for preparing the inductance matrix of the electronic circuit;
    means for discriminating whether or not the inductance matrix is a positive definite by obtaining and checking the value of minor determinants of the matrix;
    means for determining that the circuit is passive if the values of the diagonal items in the matrix are positive definites and that the circuit is not passive if at least one of the values of the diagonal items in the matrix is not a positive definite; and
    means for deriving additional information indicating a cause for non-passivity, from information of the minor determinants, when the circuit is not passive.

6. The circuit simulator of claim 5, wherein the means for outputting the result of the discrimination further comprises:
    means for outputting the additional information derived from the means for deriving additional information.

7. A circuit simulator for determining whether a linear circuit element circuit included in an electronic circuit is passive before circuit analysis of the electronic circuit by a circuit analysis simulator comprising:
    means for preparing an inductance matrix of the electronic circuit;
    means for discriminating whether or not the inductance matrix is a positive definite by obtaining and checking the value of minor determinants of the matrix;
    means for determining that the circuit is passive if the values of the diagonal items in the matrix are positive definites and that the circuit is not passive if at least one of the values of the diagonal items in the matrix is not a positive definite;

means for deriving and outputting additional information indicating a cause for non-passivity, from information of the minor determinants, when the circuit is not passive; and wherein the value of the minor determinants is discriminated from the values of the diagonal terms in a modified matrix which is obtained by processing the inductance matrix by a Gaussian elimination, and the additional information is information of a local inductance matrix obtained by localizing a portion where the value of the diagonal item in the matrix is not a positive definite.

* * * * *